(12) United States Patent
Gagliardi et al.

(10) Patent No.: US 9,977,056 B2
(45) Date of Patent: May 22, 2018

(54) HIGH VOLTAGE FIBER OPTIC SENSOR FOR THE MEASUREMENT OF AN ALTERNATING ELECTRIC FIELD

(71) Applicants: CNR—CONSIGLIO NAZIONALE DELLE RICERCHE, Rome (IT); LEDA SRL, LABORATORIO DI ELETTRODINAMICA AVANZATA, Cassino (IT)

(72) Inventors: Gianluca Gagliardi, Pozzuoli (IT); Fabrizio Marignetti, Naples (IT)

(73) Assignee: CNR—CONSIGLIO NAZIONALE DELLE RICERCHE, Cassino (IT)

( * ) Notice: Subject to any disclaimer, the term of this patent is extended or adjusted under 35 U.S.C. 154(b) by 0 days. days.

(21) Appl. No.: 15/028,271

(22) PCT Filed: Oct. 9, 2014

(86) PCT No.: PCT/EP2014/071694
§ 371 (c)(1),
(2) Date: Apr. 8, 2016

(87) PCT Pub. No.: WO2015/052294
PCT Pub. Date: Apr. 16, 2015

(65) Prior Publication Data
US 2016/0245846 A1 Aug. 25, 2016

(30) Foreign Application Priority Data
Oct. 9, 2013 (IT) .............................. MI2013A1668

(51) Int. Cl.
*G01R 29/12* (2006.01)
*G01R 15/24* (2006.01)

(52) U.S. Cl.
CPC ............. *G01R 15/24* (2013.01); *G01R 29/12* (2013.01)

(58) Field of Classification Search
CPC ....................................................... G01R 29/12
(Continued)

(56) References Cited

U.S. PATENT DOCUMENTS 5,095,514 A * 3/1992 Curtis ................ G01D 5/35377
385/12
6,097,867 A 8/2000 Brueck et al.
(Continued)

FOREIGN PATENT DOCUMENTS

DE 19902279 A1 11/1999
WO 96/17223 A1 6/1996
(Continued)

OTHER PUBLICATIONS

Floridia, C., et al., "Temperature independent electrical field optical grating based sensor for high voltage applications," Microwave and Optoelectronics Conference, 2007, IMOC 2007, SBMO/IEEE MTT-S International, IEEE, PI, Oct. 29, 2007 (Oct. 29, 2007), pp. 384-388.
(Continued)

*Primary Examiner* — Patrick Assouad
*Assistant Examiner* — Demetrius Pretlow
(74) *Attorney, Agent, or Firm* — Volpe and Koenig, P.C.

(57) ABSTRACT

A method for measuring an alternating electric field is disclosed. The method includes realizing a first diffraction grating in a first location, in a core of a silica-based optical fiber, and measuring a peak reflection wavelength of the first diffraction grating. The method also includes positioning the optical fiber along a direction having a non-zero component of an electrical field generated by an alternating voltage to be measured, and coupling a substantially monochromatic light to said optical fiber surrounded by the electric field. The method further includes measuring a parameter dependent on a shift of the peak reflection wavelength due to intrinsic
(Continued)

mechanical deformation or refractive index change of the material in which the optical fiber and the diffracting grating are realized due to the alternating electric field, and calculating a value of the electric field causing such a measured deformation or refractive index change.

12 Claims, 4 Drawing Sheets

(58) Field of Classification Search
USPC .................. 324/457, 96–97, 244.1, 332–334
See application file for complete search history.

(56) References Cited

U.S. PATENT DOCUMENTS

| | | | |
|---|---|---|---|
| 2003/0133657 A1* | 7/2003 | Kochergin | G01N 21/1717 385/37 |
| 2008/0085080 A1 | 4/2008 | Dimmick et al. | |
| 2011/0182544 A1* | 7/2011 | Lee | G01D 5/35348 385/12 |
| 2012/0093455 A1* | 4/2012 | Yi | G02F 1/2257 385/10 |
| 2013/0027030 A1* | 1/2013 | Twerdochlib | G01R 33/0327 324/244.1 |
| 2013/0271113 A1* | 10/2013 | Shan | G01R 15/241 324/96 |
| 2015/0023389 A1* | 1/2015 | Imaoka | G01K 11/3206 374/161 |
| 2015/0069996 A1* | 3/2015 | Imaoka | G01R 15/22 324/96 |

FOREIGN PATENT DOCUMENTS

| | | |
|---|---|---|
| WO | 2005/029005 A1 | 3/2005 |
| WO | 2008/042959 A2 | 4/2008 |
| WO | 2011/025573 A1 | 3/2011 |

OTHER PUBLICATIONS

Gangopadhyay, T.K., "Prospects for Fibre Bragg Gratings and Fabry-Perot Interferometers in fibre-optic vibration sensing," Sensors and Actuators A, Elsevier Sequoia S.A., Lausanne, CH, vol. 113, No. 1, Jun. 15, 2004 (Jun. 15, 2004), pp. 20-38.

* cited by examiner

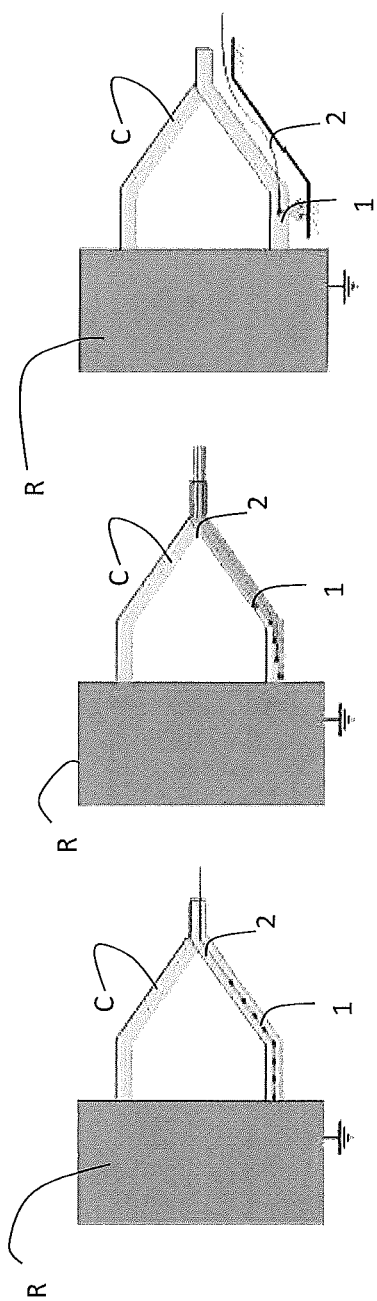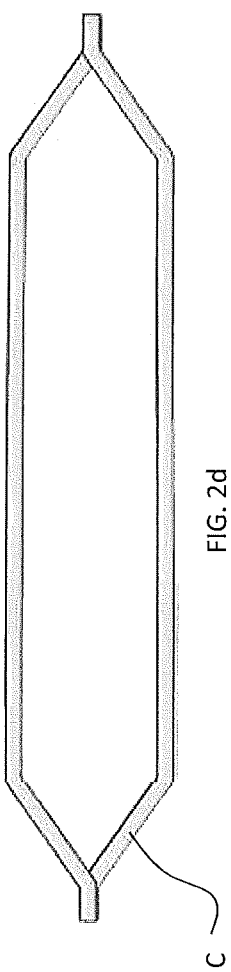

HIGH VOLTAGE FIBER OPTIC SENSOR FOR THE MEASUREMENT OF AN ALTERNATING ELECTRIC FIELD

CROSS REFERENCE TO RELATED APPLICATIONS

This application is a 371 National Phase filing of PCT/EP2014/071694 with an International Filing Date of Oct. 9, 2014, which claims the benefit of Italian Application No. MI2013A001668, which was filed on Oct. 9, 2013, and are incorporated herein by reference as if fully set forth.

FIELD OF INVENTION

The present invention relates to a method to measure an alternating electric field, and corresponding voltage, using a silica based optical fiber including a fiber diffraction grating.

BACKGROUND

Medium and high-voltage electrical equipment like electrical machines parts, cables, power converters, switches, current collectors for overhead lines, need suitable probes to measure their voltages. Medium voltages in the range lkV-30 kV can be measured by conventional voltage dividers according to the prior art. This known solution presents three main drawbacks: 1) as electrical fields are high compared to the breakdown voltage of the medium in some parts of the device, these probes cannot be used, especially in harsh environments, unless very expensive precautions are taken; 2) the insulation of voltage dividers increases the volume of the sensors and this is incompatible with the available room. This is especially true in the in the end windings of electrical machines; 3) as measurement systems operate at much lower voltage ranges than the medium and high voltages to be measured, the use of electronic measurement system poses serious safety risks both on the electrical equipment side and on the measurement instrument side.

High voltages in the range 25 kV-800 kV are generally measured with oil-filled or gas-insulated Inductive Voltage Transformers or Capacitive Voltage Transformers which are very bulky and expensive as their insulation is particularly critical.

In the case of medium voltage electrical machines, the measurement of the voltage on the insulation coating is particularly critical.

The coils of electrical machines are made by insulated wires, bars or tapes. In large generators, the coils are usually made with copper or aluminum bars, insulated externally in various ways. Generally, the insulation consists of fiber glass tapes impregnated with resins and coated in different ways. Two main coil regions can be identified in a coil of such electric machines: the active conductors and the end connections (or end windings). The active conductors are straight and are located inside the slots. In medium and high voltage generators, the outer surface of the active conductors is coated with a conductive layer, to constrain the outer voltage of the insulation to ground voltage. The connections between the active parts constitute the end windings. The potential of the outer surface of the end windings increases from zero towards the end of the slot up to the rated voltage of the machine. Electric machines operating at medium and high voltages are subjected to the deterioration of their end windings insulation. The deterioration is mostly caused by surface discharges which are due to unsatisfactory distribution of the insulation potential. Anti-corona semi-conducting coatings are often used on the outer surface of the end windings to grade, i.e. reduce, the slope of potential distribution. However, occasional damages are reported. This damage causes disruptive failures especially in synchronous generators operated at medium voltage. Voltage gradation measurements onto the surface of the anti-corona coating of the end windings may prevent this problem as it allows on-line monitoring of the voltage gradation.

The voltage of the current collectors from overhead lines especially in pantographs for railways is difficult to be measured, as in no way the overhead line voltage, which is as high as 25 kV for high speed trains, can come in contact with the carriages roof. However, the measurement of the current collector voltage is important to assess the detachments of the current collector from the overhead line and even to diagnose faults.

Even in some parts of low-voltage circuits the electric field levels may be high, discouraging the use of probes with electrical wirings.

The use of optical fibers to measure temperature, magnetic flux or strain is known.

US 2008/085080 discloses an optical fiber utilized as a sensor for measuring a parameter of interest such as temperature, strain, photonic energy intensity, electric field intensity and magnetic field intensity.

The optical fiber core includes one or more optical gratings. The optical grating(s) modifies a propagation path of selected wavelengths of light propagating through the core and acts as a spectral filter around a central "selection" wavelength. The selected wavelengths of light are determined partly by the index of refraction of the core material as dependent upon a parameter of interest applied to the core material and as varied by the optical grating(s). One or more detectors are used for determining the properties of the reflected and/or transmitted light. Knowing the properties of the reflected and/or transmitted light, a parameter of interest can be determined.

WO 2011/025573 describes a fiber optic sensor system which employs at least one light source that operates to generate light having one or more desired wavelengths. A first optical fiber based sensor transparent to a desired light wavelength operates to sense a magnetic field emitted from a predetermined electrical conductor or a current flowing through the electrical conductor. A temperature sensor that may be another optical fiber based sensor operates to sense an operating temperature associated with the first optical fiber based sensor in response to the light generated by the light source. Signal-processing electronics adjust the sensed current to substantially compensate for temperature induced errors associated with the sensed current in response to the measured operational temperature of the fiber optic sensor.

US 2013/027030 shows a magnetic flux sensor for measuring the radial component of the magnetic flux impinging on a stator bar of a high voltage generator. The magnetic flux sensor includes a fiber Bragg grating formed in an optical fiber and enclosed within a magnetostrictive coating. The magnetostrictive coating responds to changes in magnetic flux by applying a strain on the fiber that changes the reflected wavelength of the Bragg grating that can be measured to provide a measurement of the flux. In one embodiment, one or more of the magnetic flux sensors is positioned directly within an insulating layer of the particular stator bar.

WO 2005/029005 describes a system for measuring simultaneously both temperature and ac voltage and/or ac current. The system comprises: a piezo-electric sensor, an optical fiber that includes an optical strain sensor, the sensor being in contact with the piezo-electric sensor and able to expand or contract therewith and an analyzer for analyzing an optical output of the fiber and strain sensor in response to an optical input, the analyzer being operable to use the optical output to determine the temperature and the ac voltage and/or ac current.

SUMMARY OF THE INVENTION

As seen from the prior art, optical fibers are known as sensors, in particular when coupled to additional elements such as quartz or any other piezoelectric or magnetostrictive material, which is deposited or attached to the fiber external surface. Moreover, gratings are also employed, being realized in the fiber.

It has been proposed in the prior art to employ diffraction gratings, such as Fiber Bragg Gratings (FBGs), as sensors to measure strain, vibration and temperature for various applications. FBG sensors measure strain on an optical fiber at the grating locations. This strain slightly alters the spacing of reflective grating lines in the FBG and the fiber refractive index, thus affecting its reflective property. A signal is transmitted through the optical fiber to the FBG sensor. The degree of strain on the FBG is measured by the shift of the wavelength of the radiation that is reflected from the FBG. As the strain spans the fiber Bragg lines, the wavelength of the reflected light is increased proportionally. For example, for an FBG sensor strain measurement, the FBG sensor is mechanically strained by bending the structure at the FBG sensor attachment positions. For an FBG sensor vibration measurement, a mass attached to the optical fiber alters the tension in the optical fiber as it responds to vibrations at the attachment site on the coil. For an FBG sensor temperature measurement, the thermal expansion of the Bragg grating itself changes the Bragg grating line spacing as well as the fiber refractive index.

The grating produces a differing refractive index within the core of the optical fiber. When light waves propagate along the core, part of the spectrum is reflected by the grating. The reflected wavelength is known as the Bragg wavelength. The Bragg wavelength varies with events and conditions to which the optical fiber is exposed. In particular, the Bragg wavelength will vary with changes in temperature and when the optical fiber is subjected to some form of strain. By measuring the Bragg wavelength, the temperature and strain of the optical fiber can be determined.

In all the prior art documents, the fibers typically have very complex structures, such as those consisting of several cores that are sometimes coated by special coatings, or includes external elements.

In this latter prior art case, the optical fiber is in contact with the external element, external to the optical fiber, in particular in contact or in proximity of the diffraction grating realized onto the optical fiber. In this way, a mechanical deformation of this external element due to an electric field causes in turn a deformation of the fiber at the level of the diffraction grating and thus a change in the Bragg wavelength.

These external elements of the prior art undergoes a deformation when subject to an electric field due to either the electro-restrictive or the piezoelectric effect. Electrostriction is a property of all dielectric materials, due to the presence of randomly-aligned electrical domains within the material. When an electric field is applied, the opposite sides of the domains become differently charged and attract each other, reducing material thickness in the direction of the applied field (and increasing thickness in the orthogonal directions characterized by Poisson's ratio). The resulting strain (fractional length deformation) is proportional to the square of the macroscopic polarization. Reversal of the electric field does not reverse the direction of the deformation. The related piezoelectric effect occurs only in a particular class of dielectrics. Electrostriction applies to all crystal symmetries, while the piezoelectric effect only applies to few special cases. Electrostriction is a quadratic effect, unlike piezoelectricity, which is a linear effect. Thus a "two-step" procedure takes place. First the electric field has an effect onto the material in which the external element is realized, which undergoes a deformation, and this deformation in turn causes a deformation of the diffraction grating present in the attached fiber which causes a shift in its peak wavelength. This shift can be measured.

In addition, in the fiber sensor including a diffraction grating according to the prior art, a second drawback is present. The property of the fiber that is both sensitive to temperature and vibration renders the same not suitable to accurate measurements of electric fields and/or voltage, due to the fact that the temperature and/or vibration can be different in different locations of the sample where the electric field or voltage is to be measured. Thus, it is not known whether the shift of the peak wavelength is due to a change in temperature or due to the intensity of the electric field.

A goal of the present invention is to realize a sensor to measure alternating electric field and/or voltage which is simple in construction and does not require specially manufactured optical fibers. This also keeps the fiber sensor cheap, simple and compact while it makes it easy to adapt the sensor to any surface, material or structure to be monitored.

A "direct sensor" for electric field is here defined as a device in which the electric field is transduced directly into a mechanical deformation or a refractive index change which causes a shift in the Bragg wavelength of a diffraction grating.

An "intrinsic, direct sensor" is here defined as a direct sensor in which the electric field is transduced directly into a mechanical deformation or refractive index which causes a shift in the Bragg wavelength, such transduction occurring within the same material interacting with the electric field, rather than in a material near to, or in contact with, that interacting with the electric field.

An "indirect sensor" is here defined as a sensor in which the electric field is detected in a two-steps process, the first step being performed by a first device (the above called external element or device attached to the optical fiber such as a piezo-electric element), and consisting in the transduction of the electric field into strain, and the second step being performed by a second device (the optical fiber where the Bragg grating is realized) converting the strain applied into a shift in the Bragg wavelength. The two aforementioned devices have to be coupled to obtain a complete, operative indirect electric field sensor.

A disadvantage of indirect sensor is that the more complex device structure, which is actually composed by two distinct, though coupled, devices, leads to relatively high fabrication and maintenance costs. Therefore, it may be desirable to develop more efficient devices.

In other words, in the prior art document, the optical fiber including the fiber Bragg grating is used as a transducer. A first element undergoes a mechanical deformation or strain due to the presence of an electric field having a given intensity, this mechanical deformation is applied to the fiber where the Bragg grating is present and due to the mechanical deformation of the first element, also the optical fiber including the Bragg grating undergoes a mechanical deformation. This induced mechanical deformation causes a change in the peak wavelength of the diffraction grating.

The goal of the invention is to realize an intrinsic direct sensor of electric field where the material which is subject to the electric field undergoes a mechanical deformation or refractive index change thus producing a shift in the Bragg grating without the presence of any external element. Furthermore, the intrinsic direct sensor realized according to the method of the invention can measure an alternating electric field in an accurate manner.

A further goal of the present invention is to realize a sensor to measure alternating electric field and/or voltage which is simple in construction and does not require specially manufactured optical fibers. This also keeps the fiber sensor cheap, simple and compact while it makes it easy to adapt the sensor to any surface, material or structure to be monitored.

In detail, Applicants have found that a conventional telecommunications optical fiber, for example a silica-based optical fiber, can be employed to measure alternate voltages, for example having a frequency in the range from 10 Hz to the half the cutoff frequency of a photodetector (up to 1 GHz), and therefore conveniently advantageously in the range 10-500 MHz in principle.

As already mentioned, a diffraction grating has a characteristic peak wavelength, e.g. a diffraction grating reflects a specific wavelength that it is known as Bragg wavelength. This wavelength varies with events and conditions the optical fiber is exposed to.

The physical principles on which the present invention relies upon are electrostrictive effects. Electrostriction is a property of all dielectric materials, due to the presence of randomly-aligned electrical domains within the material. When an electric field is applied, the opposite sides of the domains become differently charged and attract each other, reducing material thickness in the direction of the applied field (and increasing thickness in the orthogonal directions characterized by Poisson's ratio). The resulting strain (fractional length deformation) is proportional to the square of the macroscopic polarization. Reversal of the electric field does not reverse the direction of the deformation. Electrostriction applies to all crystal symmetries, while the piezoelectric effect only applies to few special cases. Electrostriction is a quadratic effect, unlike piezoelectricity, which is a linear effect.

Applicants have discovered that, in an alternating voltage, the silica-based fiber exhibits a measurable electro-mechanical response. In other words Applicants have found that the material in which the fiber is realized, e.g. silica, exhibits a measurable electrostrictive effect. This reflects in a fiber deformation that can be efficiently sensed by the FBG in the application point.

First the electric field has an effect onto the material of the fiber element, which undergoes a deformation and changes its refractive index, and this process in turn leads to an effect in the diffraction grating which causes an overall shift in its peak wavelength. Thus, the electric field causes a shift in the Bragg wavelength directly, acting on the same material in which the grating is formed, without the need of an external element.

This shift is not covered by noise caused by temperature or strain.

Indeed, as discussed above, one of the most significant limitation of FBG is their dual sensitivity to strain and temperature which can both affect the measurement of other quantities using the optical fiber.

However, Applicants have noted that in case of a measurement of alternate voltages or electric field, the shift in the diffraction wavelength of the gratings due to thermal drift is not seen due to the fact that it is either not periodic or much slower than the frequencies contained in the measured quantity. Other strains with frequencies different from the measured electric field can be filtered away as well.

In the case of the measurement of low-frequency electric-fields as for the end windings of large turbo generators, ambient mechanical noise does not affect the measurement performance because its typical frequency components lie within the acoustic range, compared to the electric field frequency. In the case of 50 Hz electrical machines and components, the mechanical stress is typically contained in an around of 100 Hz and its effects on the measurement performance can be filtered away accordingly.

According to a first aspect, the invention relates to a method of measuring an alternating electric field, wherein said method includes:

Realizing a first diffraction grating in a first location in a core of a silica-based optical fiber;

Measuring the peak reflection wavelength of said first diffraction grating;

positioning said diffraction grating of said optical fiber along a direction having a non-zero component of an electrical field generated by an alternating voltage to be measured;

coupling a substantially monochromatic light to said optical fiber surrounded by said electric field;

Measuring a parameter dependent on the shift of said peak reflection wavelength due to intrinsic mechanical deformation or refractive index change of the silica-based material in which said optical fiber and said first diffracting grating are realized due to the alternating electric field to which the material itself in which the optical fiber and first diffraction grating are realized is subjected to; and calculating a value of the electric field causing such a measured deformation or refractive index change.

Applicants have found that a conventional telecommunications optical fiber, for example a silica-based optical fiber, can be employed to measure alternate voltages. In this fiber, one or more "point-like" sensors, each one including a reflective grating, is fabricated. The fiber employed in the invention does not require any external element (e.g. transducer) or special coating material: a standard silica fiber may be adopted without pre-treatment. In this optical fiber at least a diffraction grating sensor is written in its core.

As already mentioned, each grating has a characteristic peak wavelength, e.g. each grating reflects a specific wavelength that it is known as Bragg wavelength. This wavelength varies with events and conditions the optical fiber is exposed to.

Applicants have discovered that, in an alternating voltage, the silica-based fiber exhibits a measurable electro-mechanical response. In other words Applicants have discovered that there is no need of having an external element which has to undergo a deformation in order to obtain a measurable deformation of the diffraction grating and thus a measurable shift in the Bragg wavelength. The electric field causes directly a fiber deformation that can be efficiently sensed by the FBG in the application point. This shift is not covered by noise caused by temperature or strain.

The magnitude of the electric field which is measurable using the sensor of the invention is limited by the breakdown of the dielectric medium that constitutes the sensor, so changing the material forming the dielectric changes the maximum measurable electric field's magnitude.

This effect measured directly in the material in which the fiber, i.e. the grating, is formed is an electrostrictive effect. Applicants have thus found that in silica itself forming a diffraction grating when immersed in an alternate electric field shows an electrostrictive effect strong enough that it causes a measurable shift of the peak wavelength of the grating.

As mentioned above, the electrostrictive effect is a quadratic effect, i.e. the deformation has a quadratic dependence on the electric field. The electrostrictive effect is a microscopic deformation of the dielectric material forming the fiber which generates a change in the refraction index of the material itself.

The fiber is a silica-based fiber, i.e. a fiber including silica and possibly any suitable dopant known in the field of optical fibers.

It is worth noticing that, due to the electrostrictive effect, electric field of many different frequencies can be measured. The bandwidth of the sensor is very wide, reaching under certain conditions also the microwave range of frequencies. Indeed, the electrostrictive effect is both a macroscopic effect where the material undergoes a deformation, and also a microscopic effect where the refractive index of the material changes. The electrostrictive effect is thus a "fast" effect which allows a measurement of very rapidly varying electric fields, even in the radio-frequency or microwave range, i.e. electric field having a very high frequency.

Electric-field induced deformation and/or refractive index changes yield a shift of the FBG peak wavelength. This shift, if resulting from an AC field, may be readily measured by either monitoring the FBG reflected power on the side of its spectral response or frequency locking a laser on its peak center (the feedback signal used for locking would provide direct measurement of the field amplitude in this case).

The feedback signal from the fiber has twice the frequency of the electric field. Preferably, more than one diffraction grating is realized on the fiber so that a plurality of sensing points is obtained.

Therefore, the mechanical deformation of the fiber material itself, i.e. of the silica-based material, directly due by the electric field without external elements or special coating is used to obtain a shift in the Bragg peak which is a function of the electric field applied.

A measure of the electric field can be thus obtained using a standard silica fiber, such as a telecommunications fiber, without using any special and complex apparatus.

Other strains with frequencies different from the measured electric field can be filtered away, such as temperature variations. Therefore, due to the fact that the electric field has a pre-determined frequency, it is possible to filter out other causes of Bragg wavelength drift due to the fact that they have different frequencies than the one of the alternating electric field to be measured.

It is worth emphasizing that the fiber of the invention, in the location where the diffraction grating is realized, is free from any external element, such as a transducer, due to the fact that the fiber is an intrinsic direct sensor of the electric field. Further, it might also be free from any coating. What is measured is the shift of the peak grating due to a mechanical deformation of the material in which the grating itself is formed cause by the presence of the electric field. The fiber material thus deforms due to the electro-restrictive effect of the material itself, not of another material in contact with the fiber.

This method is well suited for the measure of electric field in harsh environments such as in medium and high-voltage electrical generators and components.

The method includes measuring the electrical field component of the electrical field along the direction in which the optical fiber is positioned.

The invention measures the component of the electric field in the direction of the optical fiber. By using a number of interferometric structures in the optic fiber, the component of the electric field E in the direction of the optic fiber can be measured in the points where the interferometric structures are placed.

More generally, the voltages that can be measured by the invention are preferably in the range 100 V-800 kV. However, also low voltage electric measurements can be made. Voltage measurements result from electric field measurements by an integration of the latter in several positions.

The range of measurements is indeed more extended than that, as the invention measures directly the electric field and is limited by the dielectric breakdown of the medium. One device built with the proposed method was tested at electric fields up to 33 kV/cm, which is the dielectric strength of dry air, at standard temperature and pressure.

Preferably, said optical fiber is a single-mode optical fiber.

In order to measure the voltage gradation in a number of given points, for example along the end windings of electrical machines, preferably the method of the invention includes:

Realizing a second diffraction grating either in a second location, separated by a given longitudinal distance from said first location, of said silica-based waveguide or in a location on a second silica-based waveguide;

computing a value of alternating voltage generating said electric field from the simultaneous electric field measurements of the at least first and second diffraction gratings.

In order to obtain, from the electric field measurements, a voltage measurement, at least two diffraction sensors should be present according to a preferred embodiment, so that a numerical integration of the electric field component along the fiber direction can be made. Two embodiments have been developed by Applicants: the same fiber can include in different location more than a diffraction grating, separated by a given length, or more than one optical fiber can be present, each fiber including a diffraction grating realized in its core.

A single fiber having more gratings is cost effective, although it does not allow to make measurements of the electric field at the same time in all sensing points, as the interferometric structures must be interrogated serially. The second variant allows measuring the electric field in all sensing points at the same time, but requires more optic fibers to be used.

In this embodiment, preferably the step of realizing the first and second diffraction grating includes realizing the first and second Bragg gratings on a core of the same optical fiber.

Alternatively, the step of realizing the first and/or second diffraction grating includes realizing the first and second diffraction gratings on a core of a first and second optical fibers, said optical fibers being positioned along the same direction within said electric field.

In a preferred embodiment, the step of imputing a substantially monochromatic light includes the step of inputting a laser light into said optical fiber, said laser including one of a broadband laser tunable wavelength laser and fixed wavelength laser.

Preferably, a laser source is used as the light source to be inputted into the fiber so as to measure the diffraction peak of the gratings and its shift due to the mechanical deformations and refractive index changes caused by the electric field.

Advantageously, the step of realizing a first and a second diffraction grating includes realizing a Bragg grating, an apodized grating, a blazed grating, a chirped grating, or an amplitude modulated grating.

In addition, more than a grating in the same location of the optical fiber can be envisaged. For example, miniature optical resonators formed by FBG pairs or 'photonic bandgap' devices within the grating structure (e.g. phase-shifted gratings) can be realized on the optical fiber.

Advantageously, measuring the shift of said diffraction wavelength includes:

Receiving a diffracted light from said diffraction grating in a photodetector.

In order to detect the diffracted light, preferably a photodetector is employed.

Preferably, the step measuring a parameter includes measuring a parameter dependent on the shift of said diffraction wavelength due to converse piezoelectric effect of the material in which the optical fiber is realized.

Applicants have observed that the dependence of the shift of the Bragg peak is dependent linearly on the strength of the electric field, thus suggesting a piezoelectric effect taking place within the fiber. Also, it was experimentally proven that this method is insensitive to the field components orthogonal to the optic fiber.

In a preferred embodiment, the positioning of said optical fiber includes positioning said fiber on the coil of a generator.

In this embodiment, the method includes positioning said fiber on the end-winding surface of said coil.

As mentioned, this method is particularly suitable for performing voltage and electric measurements in harsh environments as that of a generator. In particular, the fiber can be in direct contact to the surface of the coil, where for example an anti-corona coating can be present. The measurement points are thus located in fixed positions, for example along the end winding.

BRIEF DESCRIPTION OF THE DRAWINGS

Further advantages of the invention will be better understood with a detailed description thereof, with reference to the appended drawings, in which:

FIGS. 2a-2d are schematic drawings showing possible applications of the sensor of the invention;

DETAILED DESCRIPTION OF THE PREFERRED EMBODIMENTS

Figure 1:
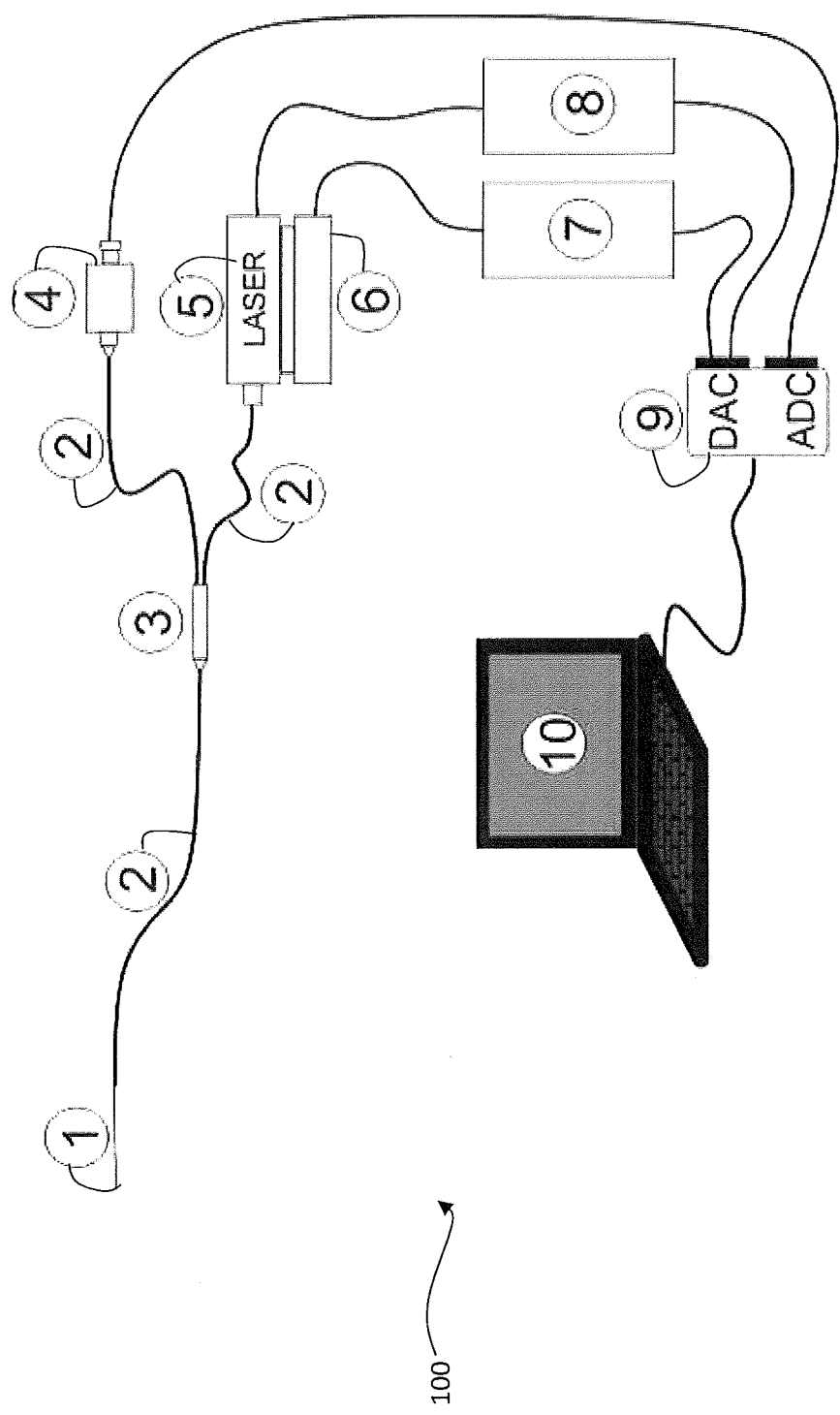
FIG. 1 is a schematic view of the experimental set up in order to perform the method of the invention.

With initial reference to FIG. 1, with 100 an optical set up apparatus for the measurements of an alternate electric field is disclosed.

The interrogation set-up apparatus 100 for measurement of electrically-induced differential electrostrictive-piezoelectric modification of a fiber Bragg grating in an optical fiber which is immersed in an alternating electric field includes an optical fiber 2, which is preferably a standard telecommunication optical fiber, more preferably single mode, in which the fiber Bragg grating (FBG) 1 is formed. The fiber 2 does not have any coating.

The apparatus 100 further includes a photodiode 4, such as for example a battery-powered InGaAs photodiode, and a laser source 5, preferably of the fiber-pigtailed type. The FBG peak wavelength is preferably centered within the laser emission wavelength range. A programmable/tunable current supply 8 is preferably used to feed the laser source 5 and to adjust the frequency of the electromagnetic radiation outputted by the laser source 5. A temperature control device 7 (e.g. involving a Peltier cell 6) is preferably used to kept the laser wavelength stable and apply large excursions of the wavelength when necessary. Further, in a preferred embodiment, the apparatus 100 further includes a fiber circulator/splitter 3.

The optical fibers 2 adopted for the set-up preferably, as mentioned, are all single-mode optical fibers and silica-based. The most well-known standard that is commercially available is SMF-28 fabricated by Corning but other companies produce similar fibers. The fibers are thin cylinders made of solid silica material. The outer diameter is for example 125 micron (cladding), the core diameter is 9 micron but the two parts have slightly different refractive indexes to ensure guided light propagation within the fiber. The typical transmission loss of such fibers in the telecommunication spectral window (1.4-1.6 micron) is <0.4 dB/km.

The FBG 1 is fabricated for example by UV laser inscription by an interferometric set-up. This is a very well-known scheme that allows writing grating with up to 10-6-10-5 refractive index modulation depth. The latter values are typical for FBG peak reflectivity in the order of 50-90%, which is enough for the purpose of this application. The FBGs 1 can have a length ranging between 1 cm and several cm. No special requirement is considered for voltage sensing although a long physical grating length also gives a narrower spectral feature and thus a larger 'side' slope (i.e. the sensitivity with which the grating responds to wavelength shifts caused by the applied electric field). Finally, the choice of the Bragg wavelength is dictated only by the wavelength of the available laser 5 for interrogation. A possible laser choice is for example a DFB diode laser, which in the telecommunication region possesses a high quality in terms of intensity noise, power consumption, size, cost, tenability and ease of use. A possible laser wavelength and peak wavelength of the FGB is for example 1542 nm.

Figure 6:
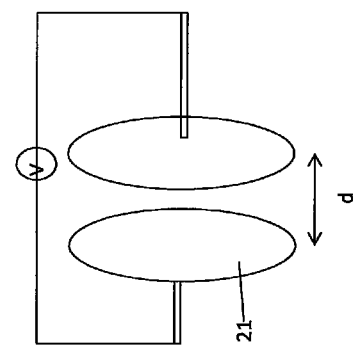
FIG. 6 is a schematic view of an experimental set up.

The invention was tested in a laboratory setup schematically depicted in FIG. 6.

The setup is composed by a single phase 50 Hz transformer 20 elevating the voltage to a maximum of 15 kV. An external autotransformer (not shown) is used to vary the primary voltage of the transformer 20. The secondary of the transformer is attached to two copper plates 21 with rounded edges. The copper plates 21 surfaces are parallel to generate a volume between them with constant electric field. If the distance of the copper plates 21 is 1 cm, the maximum electric field generated is 15 kV. The copper plates can also be moved to increase further the value of the electric field. A precision voltage divider is used to transform the secondary voltage of the transformer into a low voltage so that either a tester or an oscilloscope can be used to read its value, so the Electric Field between the plates 21 can be measured. An optic fiber 2 including the FBG 1 can be immersed in the electric field either in the direction orthogonal to the copper plates 21 (thus parallel to the field) or parallel to the plates (thus orthogonal to the field). The fiber 2 can also form a given angle with the plates.

The setup can test one fiber sensor structure at a time. The optical fiber 2 comprising the FBG 1 is immersed in the electric field generated by the two copper plates 21 through the copper tubes on either ends of the test device and its reflected light, sent to the FBG by laser source 5, is collected by a fiber circulator/splitter 3 that is connected to the photodiode 4. An oscilloscope or computer 10 monitors the voltage signal produced at the photodiode 4 output to measure the reflected light power in real time. Alternatively, an ADC and a computer board 10 can be employed for the same purpose without need for the oscilloscope. With this in mind, if a non-zero electric field is applied to the FBG 1 by a 50-Hz 1-20 kV voltage across the copper plates 21, the FBG center peak suffers a periodic shift (50 Hz modulation) due to an intrinsic electrostrictive effect of the silica material. If the laser is preliminarily tuned along the blue/red side of the FBG spectral response, i.e. at the mid-reflection point of the Bragg curve, the reflected light exhibits a periodic power change, accordingly. This sine modulation is measured at the photodiode 4 output. The amplitude of such modulation is proportional to the applied electric field between the copper plates 21 and to the slope of the FBG reflectivity curve around the mid-reflection point (depending on its specific parameters). A calibration may be carried out so to provide a direct measurement of the electric field. It is worth noting that any shift due to other (unwanted) effects, such as temperature drifts or mechanical strain acting on the fiber 2, only lead to a constant offset of the Bragg wavelength but do not affect the measurement performed at the 50 Hz frequency. In addition, sending a simple liner current sweep to the laser (e.g. adding a triangular voltage to the laser driver), the mid-reflection point may always be found in shortest observation times as it corresponds to the maximum peak-to-peak value of the photodiode sinusoidal signal.

Measurements

Figure 3:
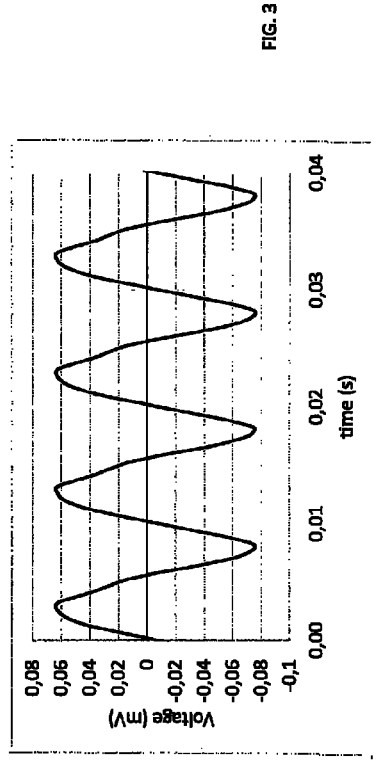
FIGS. 3 and 4 are two a graphs of the Bragg shift of the method of the invention.

The above setup of FIG. 6 was used to verify the performances of the sensor. Different voltages were applied to the plates 21 in the range 1 kV-14 kV at 50 Hz. The measurements were repeated with two values of the distance d between the plates 21. FIG. 3 shows the result of one electric field measurement at 50 Hz, 16 kV when the distance d between the electrodes 21 is 9 mm. The photodiode 4 output voltage is shown in the figure versus time: the y-axis is the photodiode output voltage. The electric field rms is 1.78.106 V/m in the case of FIG. 3.

Figure 4:
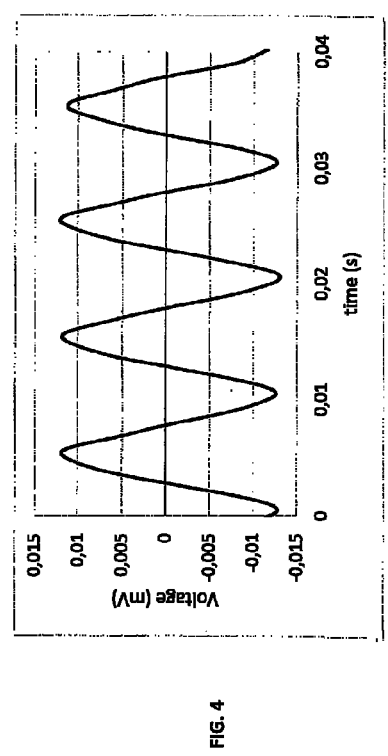

As an additional example, FIG. 4 shows the measurement at 5 kV 5.58 .105 V/m at distance d=9 mm.

Figure 5:
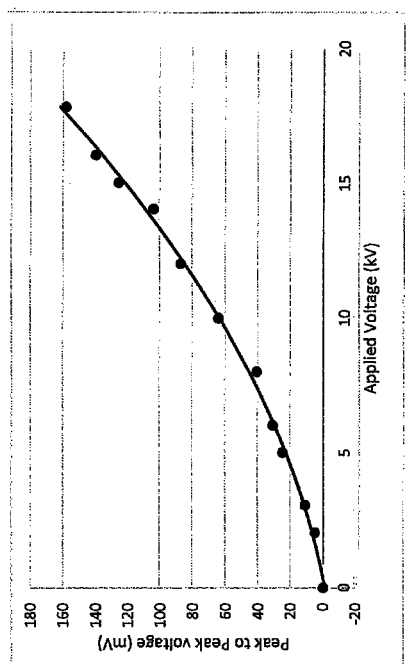
FIG. 5 is a graph of the calibration phase of the method of the invention.

FIG. 5 shows the measurements at different voltages. All measurements are carried out at 50 Hz with sinusoidal voltage applied to the plates. The distance of the plates is d=9 mm. The y-axis is the photodiode peak-to-peak output voltage of the photodiode in AC mode. Similarly, a quadratic relationship also holds if the rms voltage is used instead than the peak-to-peak voltage.

The interpolation of the experimental points is almost perfectly quadratic, which confirms the electrostrictive nature of the observed phenomenon on which the measurement method relies.

FIGS. 2a-2d show possible embodiments of a generator in which the measurement according to the method of the invention can be performed.

FIG. 2d is a simplified view of one coil C of an electrical machine. The coil is made of wound copper conductors connected either in series or in parallel. The conductors are insulated among themselves and towards the other machine parts. The straight parallel sides visible in the figure are the active coil sides. The active coil sides may be placed in slots. The remaining parts, named end windings or end connections, overhang from the machine cores. In large Medium Voltage machines, the insulation of the active sides may be coated with a conductive coating. The end windings may be coated with a semiconductive coating placed over the insulation.

FIG. 2a shows one embodiment of the invention. It is a simplified side view of the electric machine with just one coil visible. One portion of the machine core, including rotor and stator is the grey rectangle R. The fiber optic 2 is placed over one of the end windings. The dots represent the fiber gratings 1. The sensor outputs cannot be measured simultaneously. The gratings 1 are different to allow sensor interrogation with different light frequencies. As the frequencies be both sufficiently apart compatibly to the accuracy of the instruments and contained inside a frequency range, the number of sensing points is limited.

FIG. 2b represents a different embodiment of the invention which allows simultaneous interrogation of the sensors 1. A plurality of optic fibers 2 is present, each optic fiber having one sensor. The sensors can be interrogated simultaneously, and there is no limitation to the number of sensors.

FIG. 2c is an additional embodiment of the invention. One fiber optic 2 is equipped with one sensor 1 and a rail-wheel system W allows positioning of the sensor at different points of the end windings.

The invention claimed is:

1. A method of measuring an alternating electric field, wherein said method includes:
providing a first diffraction grating in a first location and in a core of a silica-based optical fiber to form an intrinsic direct sensor;
measuring a peak reflection wavelength of said first diffraction grating;
positioning said optical fiber along a direction having a non-zero component of an electrical field generated by an alternating voltage to be measured;
coupling a substantially monochromatic light to said optical fiber surrounded by said electric field;
measuring a parameter dependent on the shift of said peak reflection wavelength due to intrinsic mechanical deformation or refractive index change of the intrinsic direct sensor due to the alternating electric field to which the intrinsic direct sensor is subjected to; and
calculating a value of the electric field causing such a measured deformation or refractive index change.

2. The method of measuring an alternating electric field according to claim 1, wherein said step of measuring a parameter dependent on the shift of said peak reflection wavelength includes measuring a parameter dependent on the shift of said peak reflection wavelength due to the intrinsic electro-restrictive effect of the material in which said optical fiber and first diffraction grating are realized when subject to said alternating electric field.

3. The method of measuring an alternating electric field according to claim 1, wherein said optical fiber is free from an attached electric-field sensitive element at or in proximity to the first location where said first diffraction grating is realized.

4. The method of measuring an alternating electric field according to claim 1, including:

providing a second diffraction grating either in a second location, separated by a given longitudinal distance from said first location, of said silica-based optical fiber or in a location on a second silica-based optical fiber; and deriving a value of alternating voltage generating said electric field from simultaneous electric field measurements of the at least first and second diffraction gratings.

5. The method of measuring an alternating electric field according to claim 4, wherein the steps of providing the first and second diffraction gratings include providing first and second Bragg gratings on a core of the optical fiber.

6. The method of measuring an alternating electric field according to claim 4, wherein the steps of providing the first and second diffraction gratings include providing the first and second diffraction gratings on a core of said optical fibers, said optical fibers being positioned along the same direction within said electric field.

7. The method of measuring an alternating electric field according to claim 1, including measuring the electrical field component of the electrical field along the direction in which the optical fiber is positioned.

8. The method of measuring an alternating electric field according to claim 1, wherein said optical fiber is a single mode-optical fiber.

9. The method of measuring an alternating electric field according to claim 1, wherein the step of coupling a substantially monochromatic light includes the step of inputting a laser light into said optical fiber, said laser light including one of a broadband laser tunable wavelength laser and fixed wavelength laser.

10. The method of measuring an alternating electric field according to claim 4, wherein the steps of providing the first and second diffraction gratings include providing a Bragg grating, an apodized grating, a blazed grating, a chirped grating, or an amplitude modulated grating.

11. The method of measuring an alternating electric field according to claim 1, wherein measuring the parameter dependent on the shift of said peak reflection wavelength includes:

receiving a diffracted light from said first diffraction grating in a photodetector.

12. The method of measuring an alternating electric field according to claim 1, wherein said alternating electric field has a frequency range comprised between 10 Hz and 500 MHz.

* * * * *